United States Patent [19]

Edmond et al.

[11] Patent Number: 5,093,576
[45] Date of Patent: Mar. 3, 1992

[54] HIGH SENSITIVITY ULTRAVIOLET RADIATION DETECTOR

[75] Inventors: John A. Edmond, Apex; Calvin H. Carter, Jr., Cary, both of N.C.

[73] Assignee: Cree Research, Durham, N.C.

[21] Appl. No.: 670,534

[22] Filed: Mar. 15, 1991

[51] Int. Cl.$^5$ .................................... H01L 31/0264
[52] U.S. Cl. ........................... 250/370.01; 250/372; 357/30
[58] Field of Search ............... 250/370.01, 370.14, 250/372; 357/30 B, 30 D

[56] References Cited

U.S. PATENT DOCUMENTS

| | | |
|---|---|---|
| 3,504,181 | 3/1970 | Chang et al. |
| 3,563,817 | 2/1971 | Chang et al. |
| 4,124,410 | 11/1978 | Kotval et al. |
| 4,346,395 | 8/1982 | Ouchi |
| 4,531,142 | 7/1985 | Weyrich et al. |
| 4,571,448 | 2/1986 | Barnett |
| 4,772,335 | 9/1988 | Huang |
| 4,865,685 | 9/1989 | Palmour |
| 4,866,005 | 9/1989 | Davis et al. |
| 4,912,063 | 3/1990 | Davis et al. |
| 4,912,064 | 3/1990 | Kong et al. |

OTHER PUBLICATIONS

G. L. Harris and C. Y. -Wang; Amorphous and Crystalline Silicon Carbide and Related Materials; Proceeding of the First International Conf., Washington, DC, Dec. 10 and 11, 1987; pp. 25-33.

R. B. Campbell and Hung-Chi Chang; Detection of Ultraviolet Radiation Using Silicon Carbide p-n Junctions; Solid-State Elect.; vol. 10, pp. 949-953.

P. Glasow and G. Ziegler; SiC-UV-Photodetectors; SPIE vol. 868 Optoelectronic Tech. for Remote Sensing from Space (1987).

Primary Examiner—Janice A. Howell
Assistant Examiner—Richard Hanig
Attorney, Agent, or Firm—Bell, Seltzer, Park & Gibson

[57] ABSTRACT

A high sensitivity radiation detecting photodiode formed in silicon carbide comprises a monocrystalline silicon carbide substrate; a first monocrystalline portion of silicon carbide upon the substrate and having a first conductivity type; a second monocrystalline portion of silicon carbide adjacent the first portion and having the opposite conductivity type from the first portion; and a p-n junction between the adjacent first and second portions. The photodiode provides a dark current density of no more than about $1 \times 10^{-9}$ amps/cm$^2$ at a reverse bias of $-1.0$ volts and at temperatures of 170° C. or less.

27 Claims, 7 Drawing Sheets

SiC PHOTODETECTOR RESPONSE

HIGH SENSITIVITY ULTRAVIOLET RADIATION DETECTOR

FIELD OF THE INVENTION

The present invention relates to photodetectors for use in detecting radiation in the ultraviolet range, and in particular relates to a photodiode formed in silicon carbide.

BACKGROUND OF THE INVENTION

The detection of electromagnetic radiation of various frequencies has a number of important applications. Because of the well understood relationship between light energy and various physical, electrical and chemical phenomena, many such events can be identified by the frequency (or correspondingly by the wavelength) of the electromagnetic radiation that they emit or absorb. As typical examples, movements of atoms within molecules tend to emit radiation in the infrared portion of the spectrum. Transitions within the nucleus of atoms tend to emit radiation in the X-ray frequencies. Rotational movements of molecules tend to emit in the microwave frequencies. Electronic transitions between energy levels in molecules and atoms tend to emit and absorb in the visible portion of the spectrum and, of particular interest to the present invention, in the ultraviolet portion of the spectrum.

As brief background, the characteristics of light energy are most frequently expressed as wavelength (the length of one complete periodic wave cycle) and frequency (how many complete cycles occur in a given time period). It is well understood that wavelength and frequency are inversely proportional to one another and related to the speed of light by the relationship:

$$Wavelength \ X \ Frequency = Speed \ of \ Light$$

or, expressed in the usual symbols:

$$\lambda \nu = c$$

Longer wavelengths thus correspond to smaller frequencies and shorter wavelengths correspond to higher frequencies. In turn, the frequency of light emitted or absorbed as a result of a particular event is directly proportioned to the energy associated with the event. This is conveniently expressed as:

$$E = h\nu$$

in which E represents energy, $\nu$ represents the frequency, and h represents Plank's constant.

Detection of ultraviolet radiation is of particular interest because such radiation is typically produced by combustion phenomena. Thus, ultraviolet radiation detectors can discriminate between the presence of combustion and the presence of heat in a manner in which infrared radiation detectors, which tend to indicate the presence of heat regardless of the presence of combustion, cannot.

As would be expected, the ability to detect ultraviolet radiation has a number of significant commercial and military applications. As one commercial example, some type of ultraviolet detector is a required component in any system using ultraviolet light to transmit information. Because ultraviolet light has a higher frequency than visible light, it can carry more information. Thus, the use of ultraviolet detectors in fiber optical information transmission systems and couplings is of particular interest.

In military applications, the detection of the presence of combustion, particularly in a highly sensitive manner, has obvious advantages such as identifying the presence of aircraft, missiles, or other objects propelled by characteristic combustion processes. In such military applications, a further desirable advantage is for the detector to be "solar blind." In other words, because the ultraviolet and visible portions of the electromagnetic spectrum are adjacent one another, ordinary visible sunlight can tend to cause a response in an ultraviolet detector down to approximately 290 nanometers (nm) which can either blind the detector to the presence of ultraviolet radiation or greatly reduce its sensitivity.

One way of detecting radiation, regardless of frequency or wavelength is to expose a semiconductor ("solid state") material to the radiation and note the response in the semiconductor material. Semiconductors are particularly advantageous for detection systems for a number of well known reasons. These typically include their small size, stability, reliability and lower cost. Solid state photodetectors fall into separate categories which generally include photoconductors, photodiodes and phototransistors. A photoconductor is a portion of semiconductor material with ohmic contacts affixed to opposite ends. When struck by incident light, carriers are generated therein which result in an increase in the material's conductivity. A photodiode is a p-n junction device with an associated depletion region. The depletion region's electric field separates photogenerated electron-hole pairs, the movement of which generates a measurable current. A phototransistor is similar to a conventional bipolar transistor but has a large base-collector junction as the light collecting element. Of these devices, the photodiode is one of the most commonly used photodetection device for visible and ultraviolet light.

Operation of a Photodiode

As known to those familiar with such devices, electromagnetic radiation of an appropriate energy that strikes a semiconductor material will generate electron-hole pairs by a normal photoconductive action. When these charge carriers are generated near a p-n junction, the electric field of the depletion layer at the junction separates the electrons from the holes in normal p-n junction fashion. This separation gives rise to a short circuit current or open circuit voltage which is referred to as the photovoltaic effect.

In the absence of external bias all p-n junctions produce an equilibrium state with an internal potential barrier across the junction. This barrier creates the depletion region and prevents majority carriers from crossing the junction. In reverse bias, minority carriers, however, can cross the junction and when they do, they create the small reverse leakage current typical of junction diodes.

In the absence of external bias, when the n region of a photodiode is illuminated, electron-hole pairs are generated and holes (which are the minority carriers in the n region) near the depletion layer are swept across the junction by the depletion region electric field. This flow of holes across the junction produces a current called the photocurrent. Similarly, if the p region is illuminated and electron-hole pairs generated, the electrons (the minority carriers in the p region) are swept across the junction to produce the photocurrent. The majority of photocurrent will be generated as light penetrates to the depletion region. At that position, electron-hole pairs are likewise swept by the electric field.

The effect of the photocurrent on the current-voltage (I-V) characteristics is to cause a displacement of the normal I-V curve in which the usually small reverse bias leakage current is augmented by the photocurrent.

The magnitude of the photocurrent depends upon the number of charge carriers generated, which in turn depends upon the illumination of the diode element. Nevertheless, when significant forward current flows through the diode, the relatively small photocurrent is swamped by the typically much larger forward current. Thus, the part of the characteristic current voltage (I-V) relationship of interest is that portion where reverse current flows; i.e. quadrants III and IV in the current-voltage plot of an illuminated diode. Furthermore, for the same reason, photodiodes are normally operated in reverse bias. That is, the relatively small photocurrent is more easily detected against the relatively small reverse current (also referred to in the art and herein as the "dark" current) than against the relatively large forward current.

It will thus be understood that if the dark current under reverse bias of a photodiode is relatively large, the marginal addition of a photocurrent will be difficult to detect; i.e. the device will lack sensitivity. As a hypothetical example, if the dark current at a reverse bias of 1 volt were 1 amp, and the photocurrent were 0.1 amp, the total detected current would be 1.1 amp, of which only about 9 percent would be related to the illumination detected. Alternatively, if the dark current at the same reverse bias were only 0.1 amp, the additional 0.1 amp photocurrent would represent 50 percent of the total 0.2 amp current produced by the diode when illuminated, a proportional increase that is much more clearly detectable.

Therefore, a relatively low dark current is required for a reasonably sensitive photodiode.

When a forward bias is applied to an illuminated photodiode, the magnitude of the reverse current decreases as the majority carrier forward current increases. Eventually, the majority carrier current equals the photocurrent, and no net current flows through the diode. If the forward bias is increased beyond this point, a forward current flows as in a normal junction diode, minus the photocurrent. Thus, the limiting values in quadrant IV are the current at zero voltage bias, and alternatively the forward voltage at which the current is zero. The current at zero bias is referred to as the short circuit current, and the voltage at zero current is referred to as the open circuit voltage. Generally speaking, the diode will have operating characteristics in reverse bias that correspond to the current-voltage curve between the short circuit and the open circuit voltage.

The Characteristics of Semiconductor Materials

As is known to those familiar with the characteristics of light and materials, because of the limitations of quantum mechanics, the atomic and molecular structure of a semiconductor material will dictate the frequencies (or wavelengths) of light to which it is responsive, or which it will emit. The ultraviolet region is normally defined as electromagnetic radiation having wavelengths of between about 100 to 3900 angstroms (10 to 390 nanometers (nm). Within this range, wavelengths of 300-390 nm are referred to as "near" ultraviolet, wavelengths of 200-300 nm as "far" ultraviolet, and 10-200 nm as "extreme" ultraviolet. Expressed as electron-volts, the near UV range is 3.18 to 4.13 eV, the far UV range is 4.13 to 6.20 eV, and the extreme UV range is 6.20 to 124 eV.

With respect to semiconductor materials, the light that can be absorbed in a carrier generating fashion thus must have an energy at least as great as the material's band gap. Thus, as in almost every other application of semiconductor technology, the band gap of a material is the fundamental characteristic in determining whether or not it can detect certain radiation, and how well. For example, silicon (Si) has a band gap of 1.12 electron volts (eV) at 300K (approximately room temperature). Gallium arsenide (GaAs) has a band gap of the same temperature of 1.42 eV, gallium phosphide (GaP) 2.26 eV, gallium nitride (GaN) 3.6 eV, indium arsenide (InAs) 0.36 eV, and indium phosphide (InP) 1.35 eV.

More specifically, from a detection standpoint, photons will generate carriers in a semiconductor material when those photons have an energy at least as great as the material's bandgap. thus, using silicon as an example, photons of energy of 1.12 eV or greater will generate carriers. Because 1.12 eV represents a photon wavelength of approximately 1110 nm (i.e. in the infrared region), silicon will therefore tend to detect light in the infrared, visible and UV regions. This capability may be advantageous in some circumstances, but it correspondingly fails to offer much discrimination when the goal is to specifically detect ultraviolet radiation.

As another factor, the particular responsivity of semiconductor materials is also dependent upon the wavelength of the incident light. More specifically, semiconductor materials tend to be most responsive to photons having wavelengths representing energy near the material's bandgap. In this regard, the wavelength of the longest wavelength photon (lowest frequency and lowest energy) that will generate carriers in a semiconductor is sometimes referred to as the "band edge," so that the material can be said to be most responsive to light near the band edge.

Therefore, for materials such as Si, GaAs, GaP, InAs and InP, to act as UV photodetectors, some additional discriminating factor must be included to reduce the responsiveness to infrared and visible light. Appropriate filters are typically used, but have associated disadvantages.

Desired Properties of Photodiodes

There are several properties desired in any photodetector. These include quantum efficiency, responsivity, an appropriately small dark current, an appropriately high open circuit voltage, and as stated earlier, the appropriate short circuit current.

The concept of quantum efficiency is well understood for those familiar with this art, and an appropriate discussion is set forth in SZE, PHYSICS OF SEMICONDUCTOR DEVICES, 2d Ed., John Wiley & Sons, Inc. (1981), Chapter 13, pages 743 ff. Stated briefly, the quantum efficiency is the ratio of the number of carriers generated and detected to the number of photons that strike the device. The responsivity of a photodiode is defined as the ratio of the photocurrent to the optical power, and is directly proportional to the wavelength.

The second important property is the dark current of the photodiode. As stated earlier, because a photodiode is typically operated in reverse bias with the reverse leakage current being increased by the photons impinging upon the material, high leakage currents greatly reduce or even eliminate the sensitivity of such devices to various types of radiation. This reverse leakage current in a photodiode is typically referred to as the "dark current" because it reflects the amount of current flowing in reverse bias when no light is incident on the device.

As further stated above, a diode will always exhibit a dark current in reverse bias. This is caused by and represents minority carriers (i.e. holes in n-type materials and electrons in p-type materials) that reach the junction in reverse bias. In turn, the number of minority carriers that reach the junction in reverse bias will be related to the total number of minority carriers. For example, the intrinsic carrier concentration of a p-type semiconductor can be expressed according to the following formula:

$$n_i^2 = p_p n_p$$

wherein $n_i^2$ represents the intrinsic carrier concentration, $P_p$ represents the number of majority carriers and $n_p$ represents the number of minority carriers for a p-type material.

Stated differently, the dark current is directly proportional to the number of minority carriers so that the greater the number of minority carriers the greater the dark current, and the lower the sensitivity of the photodiode. In turn, the number of minority carriers is related to the material's bandgap. This occurs because the presence of minority carriers is at least partially temperature-dependent; i.e. some carriers move upward from the valence band to the conduction band because of heat energy. Therefore, for a material with a smaller bandgap, a greater number of carriers will be thermally generated at any given temperature. Alternatively, for a material with a larger bandgap, fewer minority carriers will be thermally generated at any given temperature and thus the reverse dark current will be correspondingly lower at any given temperature.

The next desirable characteristic of a photodiode is its open circuit voltage. This is again determined by the nature of the semiconductor; see SZE p. 794 in which it is set forth that the open circuit voltage is inversely proportional to the diode saturation current; which in turn is related to the particular material and therefore its band gap. Because of the inverse proportionality, the smaller the diode saturation current the larger the open circuit voltage.

The Nature of Silicon Carbide

Silicon carbide, a IV—IV compound semiconductor, has long been a candidate material for use in the manufacture of such semiconductor electronic devices. Silicon carbide has a number of characteristics which make it theoretically advantageous for such uses. These include a wide band gap, a high thermal conductivity, a low dielectric constant, a high saturated electron drift velocity, a high breakdown electric field, a low minority carrier lifetime, and a high dissociation temperature. Taken together, these properties indicate that semiconductor devices formed from silicon carbide should be operable at much higher temperatures than devices made from other semiconductors, as well as at higher speeds and higher power levels.

As a candidate material for a photodiode, the 6H polytype of silicon carbide has a band gap of 2.92 eV at 300K. Therefore, light of wavelength of about 424 nm or greater will not generate carriers in 6H silicon carbide. Stated differently, 6H silicon carbide is advantageously unaffected by light of wavelengths longer than about 424 nm. Therefore, 6H silicon carbide inherently detects only in the blue, violet, and ultraviolet portions of the spectrum; i.e., the high energy end of the visible spectrum and most of the ultraviolet spectrum.

Additionally, because 6H silicon carbide's band edge is about 424 nm, it has a much higher responsivity to wavelengths in the ultraviolet region, has a peak responsivity at about 270 nm, and detects only a relatively small portion of wavelengths within the visible spectrum.

Again in comparison, the open circuit voltage for a silicon photodiode is going to be on the order of about 0.47 volts, while for a 6H silicon carbide diode the open circuit voltage will be approximately 2.3 volts.

As for minority carrier concentration, the following example illustrates silicon carbide's advantages. For silicon, $n_i$ equals approximately $10^{10}$ cm$^{-3}$ while for 6H silicon carbide $n_i$ is approximately $10^{-5}$ cm$^{-3}$; i.e. 15 orders of magnitude lower. Therefore, as a hypothetical example, for a p-type sample of silicon carbide with a typical doping level of approximately $10^{17}$ cm$^{-3}$, the population of minority carriers (electrons) can be obtained by dividing the square of the intrinsic carrier concentration by the p-type carrier concentration; i.e.:

$$n_p = n_i^2 / p_p$$

When this calculation is carried out for silicon, the minority carrier concentration is $10^3$ cm$^{-3}$. When carried out for silicon carbide, the far lower intrinsic carrier concentration results in a correspondingly far lower minority carrier concentration of $10^{-27}$ cm$^{-3}$; i.e., 24 orders of magnitude lower.

This means that the number of intrinsic minority carriers in silicon carbide is extremely small and these fewer carriers correspondingly result in a very small dark current. This greatly increases the sensitivity of a silicon carbide photodiode as compared to a silicon photodiode in addition to the other advantages already mentioned.

Nevertheless, photodiodes and other semiconductor electronic devices made from silicon carbide have yet to make a viable appearance in any circumstances other than laboratory research and have yet to reach their commercial potential. This lack of success results, at least partially, from the difficulty encountered in working with silicon carbide. It is an extremely hard material, often used as an abrasive. It often must be worked at extremely high temperatures under which other materials cannot be worked, and from a semiconductor standpoint, crystallizes in well over 150 polytypes, many of which are separated by rather small thermodynamic differences. For these latter reasons, production of monocrystalline thin films of silicon carbide that are necessary for certain devices, and production of large single crystals of silicon carbide which are useful as substrate material and for other applications, have remained elusive goals. Additionally, certain doping techniques which have been successfully developed for other materials have proved unsuccessful when used in connection with silicon carbide. For example, the low dark current just discussed is theoretically possible for silicon carbide but is meaningless in the absence of an excellent junction. This is demonstrated by the failures noted in the prior art references.

Several attempts at forming such detectors in silicon carbide have been carried out to date. An early attempt is described in U.S. Pat. Nos. 3,504,181 and 3,563,817 to Chang and Campbell and in their corresponding publication, DETECTION OF ULTRAVIOLET RADIATION USING SILICON CARBIDE P-N JUNCTIONS, Solid State Electronics, Vol. 10, pp. 949-953 (1967). Chang and Campbell describe attempts at producing silicon carbide solid state ultraviolet radiation detection devices in which the required p-n junction is formed by diffusing aluminum or some other suitable doping material into an n-type crystal of silicon carbide to produce the required adjacent p-n portions and junction therebetween. As is known to those familiar with semiconductor devices and silicon carbide in particular, however, diffused junctions into bulk substrates are noted for their characteristic inconsistency and lack of good electronic properties. For example, the dark current reported in the Chang '181 patent is worse than would normally be expected for a typical silicon device, in spite of the overwhelming statistical and theoretical advantages of silicon carbide. The Chang device produces a very low output voltage as indicated by FIG. 16 and by the text at Column 9, lines 11-13.

This problem is further noted in a publication by Glasow, et al. SIC-UV-PHOTODETECTORS, SPIE, Vol. 868, Opto Electronic Technologies For Remote Sensing From Space (1987), pp. 40-45. Glasow and his co-authors note that the Chang and Campbell devices were characterized by structural decomposition of surface layers during the doping process. In an attempt to improve on the Chang and Campbell devices, Glasow et al. used a silicon carbide substrate, a p-type silicon carbide epitaxial layer upon this substrate, and an implanted well of n-type silicon carbide form by ion implantation of nitrogen. The resulting devices, however, demonstrated high leakage currents in reverse bias (FIG. 3, page 42) indicating a failure to produce a good junction.

The high leakage currents of these prior art devices primarily reduce the output voltage and thus the output power of the devices. Because quantum efficiency is calculated based on output current, however, values for quantum efficiency for the prior art devices remain deceptively high even though the devices are leaky.

Recently, however, a number of developments have occurred which have successfully accomplished both single crystal bulk and thin film growth of silicon carbide. These are included in several patents that are either assigned or exclusively licensed to the assignee of the present invention, and the contents of which are incorporated entirely herein by reference. These include: U.S. Pat. No. 4,912,063 to Davis et al, "Growth of Beta-SiC Thin Films and Semiconductor Devices Fabricated Thereon;" U.S. Pat. No. 4,912,064 to Davis et al, "Homoepitaxial Growth of Alpha-SiC Thin Films and Semiconductor Devices Fabricated Thereon;" U.S. Pat. No. 4,865,685 to Palmour, "Dry Etching of Silicon Carbide;" U.S. Pat. No. 4,866,005 to Davis et al, "Sublimation of Silicon Carbide to Produce Large, Device Quality Single Crystals of Silicon Carbide;" and co-pending application Ser. No. 07/365,333, filed May 24, 1989 for "Implantation and Electrical Activation of Dopants into Monocrystalline Silicon Carbide".

Object of the Invention

Therefore, there exists the need for an ultraviolet radiation detector formed in silicon carbide that will demonstrate in a practical fashion the theoretical advantages of silicon carbide and in particular will be characterized by an excellent junction and an extremely small dark current, leading to good quantum efficiency and good output.

SUMMARY OF THE INVENTION

The invention is an ultraviolet radiation detector formed in silicon carbide formed of a single crystal substrate of silicon carbide, a first epitaxial layer of silicon carbide upon the substrate, and a top epitaxial layer of silicon carbide upon the first epitaxial layer. The first and top epitaxial layers have opposite conductivity types and form a junction therebetween. The first layer has a carrier concentration sufficiently lower than the carrier concentration of the top layer so that the depletion region of the p-n junction forms predominantly in the first layer at equilibrium. The first layer further has a thickness that is large enough to support the depletion region and greater than the diffusion length of minority carriers in the first layer so that photons reaching the first layer are predominantly absorbed therein rather than reaching the substrate and so that the corresponding carriers generated in the first layer will diffuse to the depletion region within their lifetimes. The top epitaxial layer has a defined thickness less than the thickness of the first layer and larger than the zero bias depletion layer within the top layer but small enough to avoid absorption of ultraviolet radiation. The top layer is also thin enough so that radiation in the ultraviolet range generates carriers predominantly in the depletion layer of the p-n junction.

In another aspect, the invention is a detection method in which a photodiode is exposed to electromagnetic radiation wherein the photodiode is formed of adjacent regions of silicon carbide having respective p-type and n-type conductivities with a p-n junction between the respective regions and wherein the diode has an extremely small dark current under reverse bias.

The foregoing and other objects, advantages and features of the invention, and the manner in which the same are accomplished, will become more readily apparent upon consideration of the following detailed description of the invention taken in conjunction with the accompanying drawings, which illustrate preferred and exemplary embodiments, and wherein:

DETAILED DESCRIPTION

Figure 1:
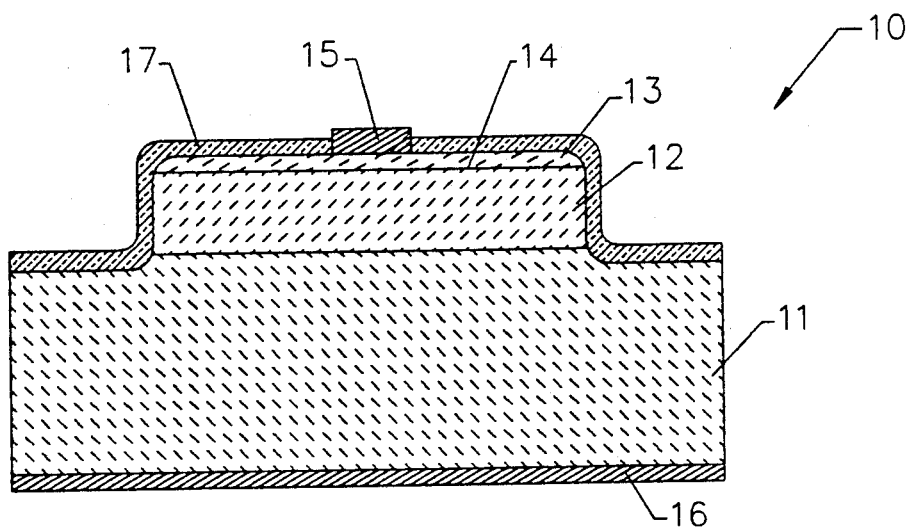
FIG. 1 is a cross sectional view of a photodetector according to the present invention.

The present invention is an ultraviolet radiation detector formed in silicon carbide, a first embodiment of which is illustrated in FIG. 1 as the photodiode generally designated at 10. The diode is formed of a single crystal substrate of silicon carbide 11 having a first conductivity type; a first epitaxial layer 12 of silicon carbide upon the substrate 11 and having the same conductivity as the substrate; and a top epitaxial layer 13 of silicon carbide upon the first epitaxial layer 12 for being exposed to incident electromagnetic radiation. The top layer 13 has the opposite conductivity type from the first layer and the substrate. The first epitaxial layer 12 and the top epitaxial layer 13 form a p-n junction 14 therebetween. Respective ohmic contacts 15 and 16 are made to the top layer 13 and the substrate 11.

The carrier concentrations of layers 12 and 13 are different from one another. Specifically, the first layer 12 has a carrier concentration that is sufficiently lower than the carrier concentration of the top layer 13 so that the depletion region of the p-n junction 14 forms predominantly in the first layer 12 at equilibrium; i.e at zero bias. In preferred embodiments, the resistivity of the substrate is between about 0.02 and 10 ohm-cm, the carrier concentration of the first layer 12 is between about 0.1 and $10 \times 10^{17}$ cm$^{-3}$, and that of the top layer 13 between about 5 and $20 \times 10^{18}$ cm$^{-3}$.

In this regard, the first layer 12 further has a defined thickness that is sufficient to support the depletion region and that is greater than the diffusion length of minority carriers in the first layer. In this manner, electron-hole pairs generated by photons absorbed in the first layer will diffuse to the junction depletion region within their carrier lifetimes. Furthermore, the carrier concentration of the top layer 13 should be large enough to substantially reduce the series and sheet resistance.

The top epitaxial layer 13 has a defined thickness that is less than the thickness of the first layer 12 and that is larger than the zero bias depletion layer width in the top layer while small enough to avoid substantial absorption of ultraviolet radiation so that radiation in the ultraviolet range generates carriers predominantly in the depletion region of the p-n junction 14.

Although the most important qualifications of the thicknesses of the first layer 12 and the top layer 13 are their functional characteristics, it has been determined according to the present invention that a thickness of no more than about 300 nm is appropriate for the top layer 13 and a thickness of between about 2 and 5 microns is appropriate for the first layer 12.

In a preferred embodiment of the invention, the substrate has p-type conductivity, the first epitaxial layer also has p-type conductivity, and the top epitaxial layer has n-type conductivity. In this embodiment, the ohmic contact of the top epitaxial layer 13 comprises nickel and the ohmic contact of the substrate comprises either aluminum or an aluminum alloy.

The preferred structure offers several advantages. First, the use of an n-type top layer offers higher conductivity and lower absorbance than would a p-type layer. This results from the lower activation energy for n-type carriers in silicon carbide than for p-type carriers. Stated differently, a lesser number of n-type dopant atoms will produce the same conductivity as a greater number of p-type dopant atoms. In turn, this means that an equivalent conductivity can be achieved with fewer dopant atoms, or a greater conductivity can be achieved with an equivalent number of dopant atoms. Greater conductivity enhances the electronic properties of the resulting device, while fewer dopant atoms enhance its optical qualities.

It will be understood, however, that an appropriate photodiode can also be formed in which the substrate has n-type conductivity, the first layer has n-type conductivity, and the top epitaxial layer has p-type conductivity. In this embodiment, the ohmic contact 15 to the top epitaxial layer 13 will comprise aluminum or an aluminum alloy and the ohmic contact 16 to the substrate 11 will comprise nickel.

As an additional advantage, in a preferred embodiment of the invention the thickness of the top epitaxial layer 13 is sufficiently greater than the thickness of the ohmic contact 15 to prevent spiking of the ohmic contact through the top epitaxial layer 13 to the first epitaxial layer 12 therebeneath. This thickness can be expressed as a ratio, and preferably the ratio of the thickness of the top epitaxial layer 13 to the thickness of the ohmic contact 15 is at least about 4:1 and preferably between about 4:1 and 6:1. In preferred embodiments, if the top layer has a thickness of about 300 nm (3000 angstroms (Å)), the ohmic contact should be limited to a thickness of no more than about 75 nm (750 Å), and preferably should be between 50 and 75 nm (500–750 Å).

In the preferred embodiments, the substrate 11, the first epitaxial layer 12 and the top epitaxial layer 13 are formed of the same single polytype of silicon carbide. Preferred polytypes are selected from the group consisting of the 6H, 4H, 2H, 15R and 3C polytypes of silicon carbide.

If desired, an anti-reflective coating 17 can be added to the top layer 13 and in most preferred embodiments is selected from the group consisting of silicon dioxide and aluminum oxide.

If further desired, the photodiode of the present invention can be used in conjunction with a solar-blind blocking filter. Such filters are commonly formed of a plurality of alternating layers of silicon dioxide (SiO$_2$) and silicon nitride (Si$_3$N$_4$) and are commonly available for UV photodetectors of all types. An appropriate filter can thus be selected and used with the present invention without undue experimentation. The filter prevents incident light of wavelengths greater than about 290 nm from reaching the top layer.

One of the outstanding characteristics of the preferred embodiment of the present invention is the high quality junction made possible by positioning the junction between the epitaxial layers rather than as a diffused area in a substrate as taught in the prior art. The high quality junction is formed in accordance with the teaching of U.S. Pat. Nos. 4,912,063 and 4,912,064 the contents of both of which are incorporated entirely herein by reference. The assignee of the present invention is the exclusive licensee of both of these patents. In particular, U.S. Pat. No. 4,912,064 discloses a method of forming epitaxial layers of alpha silicon carbide upon substrates of alpha silicon carbide in which the substrate has a flat interface surface that is inclined more than one degree off axis with respect to a basal plane thereof substantially towards one of the $<11\bar{2}0>$ directions, and with the first epitaxial layer 12 comprising alpha silicon carbide homoepitaxially deposited on the substrate interface surface.

Alternatively, the substrate can comprise 6H alpha silicon carbide and the first epitaxial layer can comprise beta (3C) silicon carbide upon the substrate. In this embodiment, the beta silicon carbide is epitaxially deposited in the [111] growth direction on the (0001) silicon face of the 6H silicon carbide substrate such that the (111) crystallography of the beta silicon carbide thin film matches the (0001) crystallography of the 6H silicon carbide substrate and so that the beta silicon carbide $(10\bar{1})$ face is parallel to the 6H silicon carbide $(11\bar{2}0)$ face and the beta silicon carbide (111) face is parallel to the 6H silicon carbide (0001) face.

Figure 3:
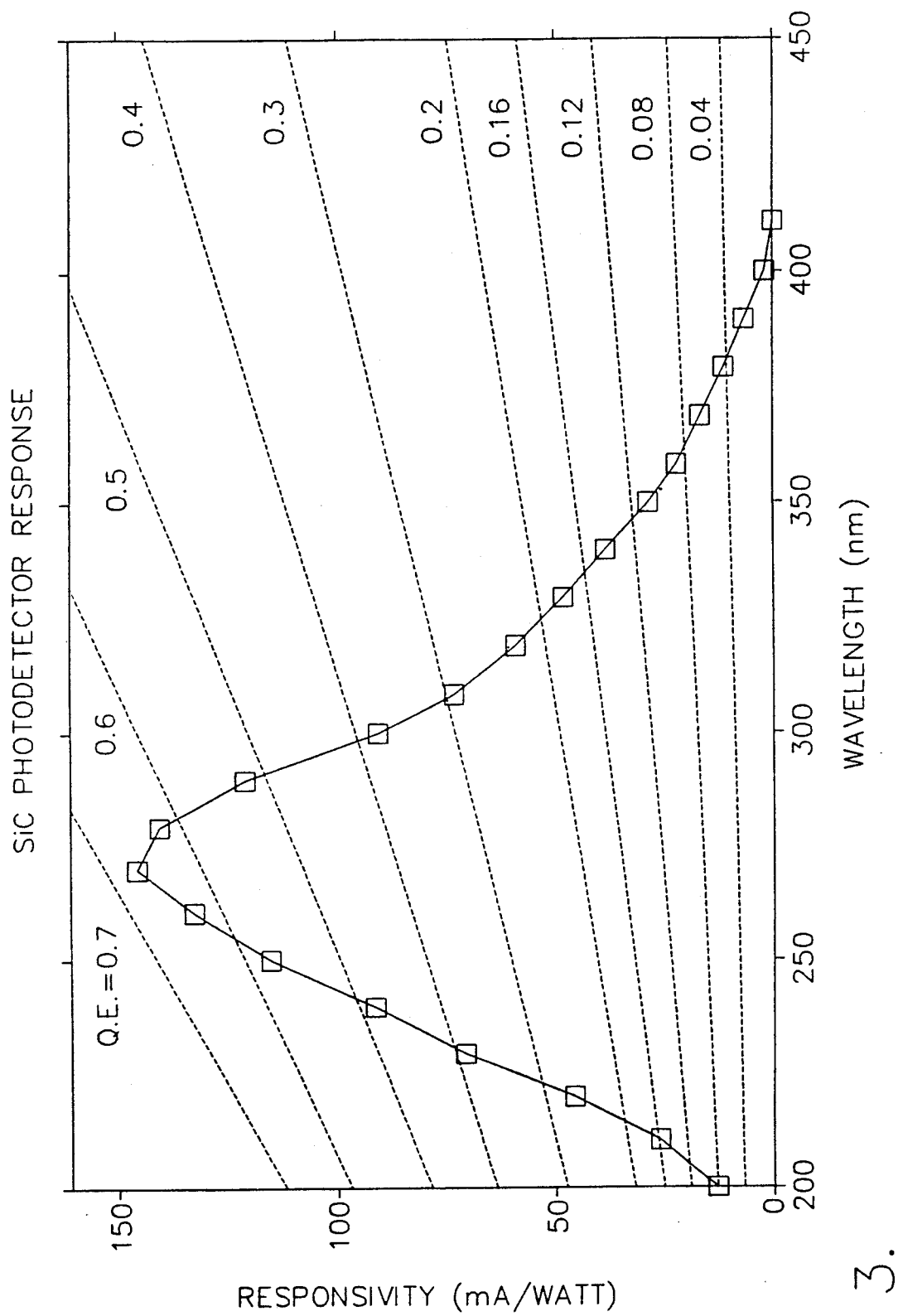
FIG. 3 is a plot of the response of the photodetector according to the present invention.

FIG. 3 illustrates the responsivity of photodiodes according to the present invention plotted as milliamps per watt against wavelength in nanometers. FIG. 3 shows that photodetectors according to the present invention have a peak responsivity at about 270 nm, an ideal position within the ultraviolet region for many applications, and have a majority of their responsivity between 220 and 320 nm, again a quite useful range within the ultraviolet region. Similarly, the diode exhibits good quantum efficiency within this responsivity range.

Figure 4:
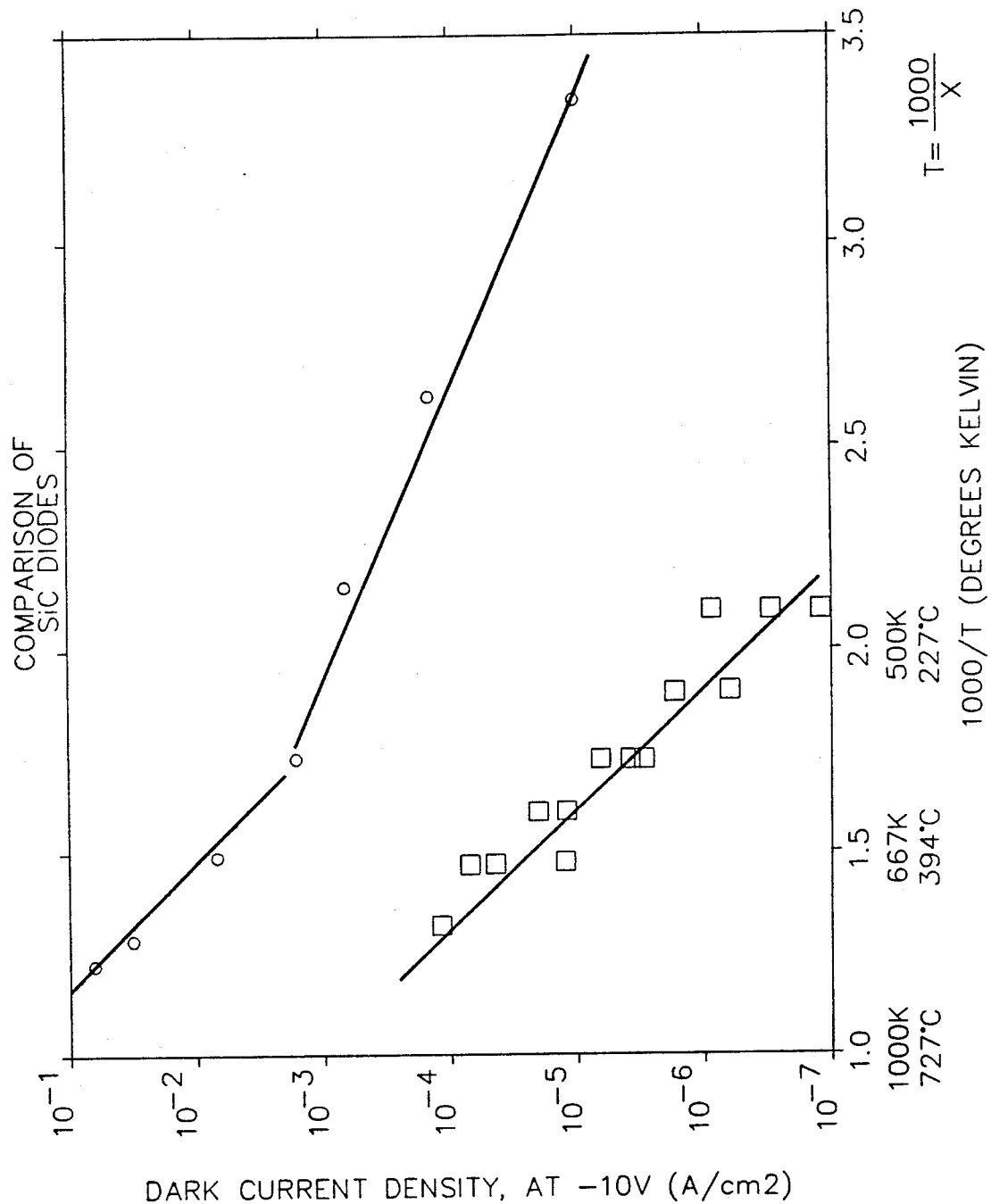
FIG. 4 is a comparison of the dark current density at a reverse bias of −10 volts of photodiodes according to the present invention compared to the dark current density at a reverse bias of −10 volts of silicon carbide photodiodes developed prior to the present invention at various temperatures.

FIG. 4 is a comparison of silicon carbide diodes formed according to the prior art with those formed according to the present invention. Diodes formed by the method of Glasow are shown by the upper line in FIG. 4, while diodes formed according to the present invention are shown by the lower line. As seen therein, for any given operating temperature, the diode dark current for diodes according to the present invention is at least two or more orders of magnitude smaller than the diode dark current of the prior art diodes. This data is also summarized in Table 1 for a device with an active area of 0.04 cm$^2$ and at a reverse bias voltage of $-1.0$ V. Table 1 expresses the dark current in femtoamps ($10^{-15}$ amps) and the temperature in degrees centigrade.

TABLE 1

| Example | Dark Current | Temperature |
|---------|--------------|-------------|
| 1       | 15           | 60          |
| 2       | 33           | 70          |
| 3       | 70           | 80          |
| 4       | 163          | 90          |
| 5       | 289          | 100         |
| 6       | 584          | 110         |
| 7       | 1097         | 120         |
| 8       | 2090         | 130         |
| 9       | 3990         | 140         |
| 10      | 7610         | 150         |
| 11      | 14,780       | 160         |
| 12      | 29,610       | 170         |

As stated earlier, and as known to those familiar with the operation of photodiodes, the minimization of the diode dark current greatly increases the sensitivity of the photodiode. Moreover, even though quantum efficiency may appear just as high for the prior art diodes, the quantum efficiency is directly proportional to the short circuit photocurrent produced rather than the output voltage and appears deceptively high in the prior art diodes even though their output voltages are rather poor because of their relatively large dark currents.

Figure 5:
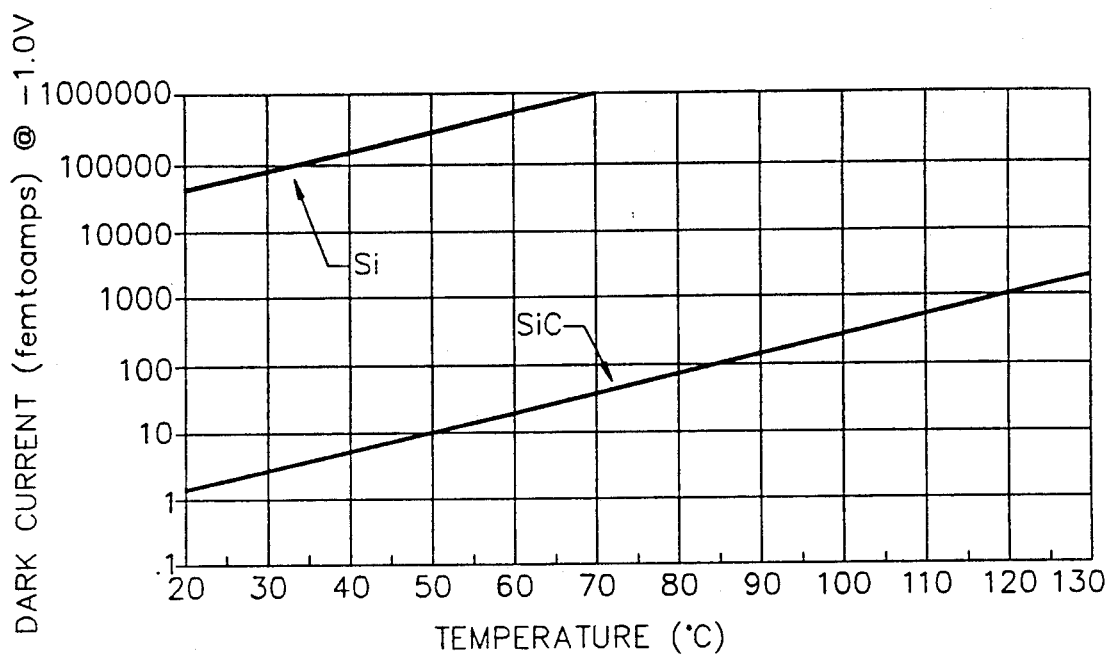
FIG. 5 is a comparison of the dark current at a reverse bias of −1.0 volt for silicon photodiodes and silicon carbide photodiodes at various temperatures.

FIG. 5 is a comparison plot of silicon photodiodes with silicon carbide photodiodes according to the present invention. All were 4 mm$^2$ in area. The characteristics of the silicon diode are typical, and in this case are those of VTB Process photodiodes, Models VTB 9412, 9413, 9414, 9415, and 9416, from EG & G Vactec, 10900 Page Blvd., St. Louis, Miss., 63132. As illustrated by FIG. 5, the dark current of silicon carbide photodiodes according to the present invention is always at least four orders of magnitude smaller than those of silicon photodiodes.

Figure 6:
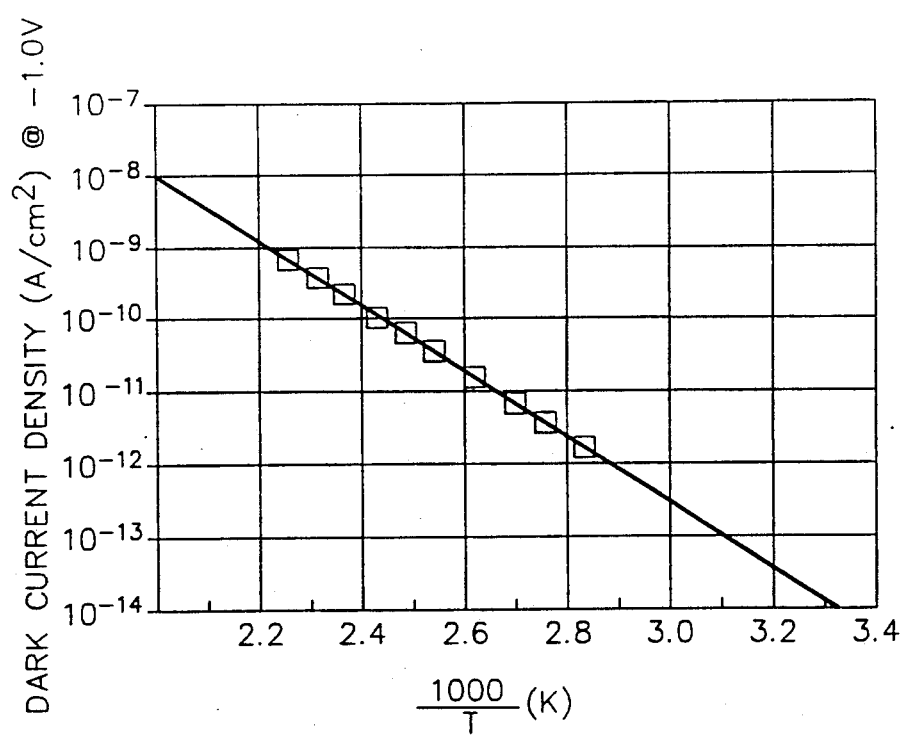
FIG. 6 is a plot of dark current density at a reverse bias of −1.0 volt for silicon carbide photodiodes at various temperatures.

FIG. 6 illustrates the characteristics of silicon carbide photodiodes according to the present invention expressed as dark current density plotted against reciprocal temperature. As demonstrated by FIG. 6, photodiodes according to the present invention have a dark current density of about $10^{-8}$ amps/cm$^2$ at a temperature of about 500K (about 227° C.) and that decreases to a current density of about $10^{-14}$ amps/cm$^2$ at a temperature of about 300K (about 27° C., i.e. approximately room temperature).

Figure 7:
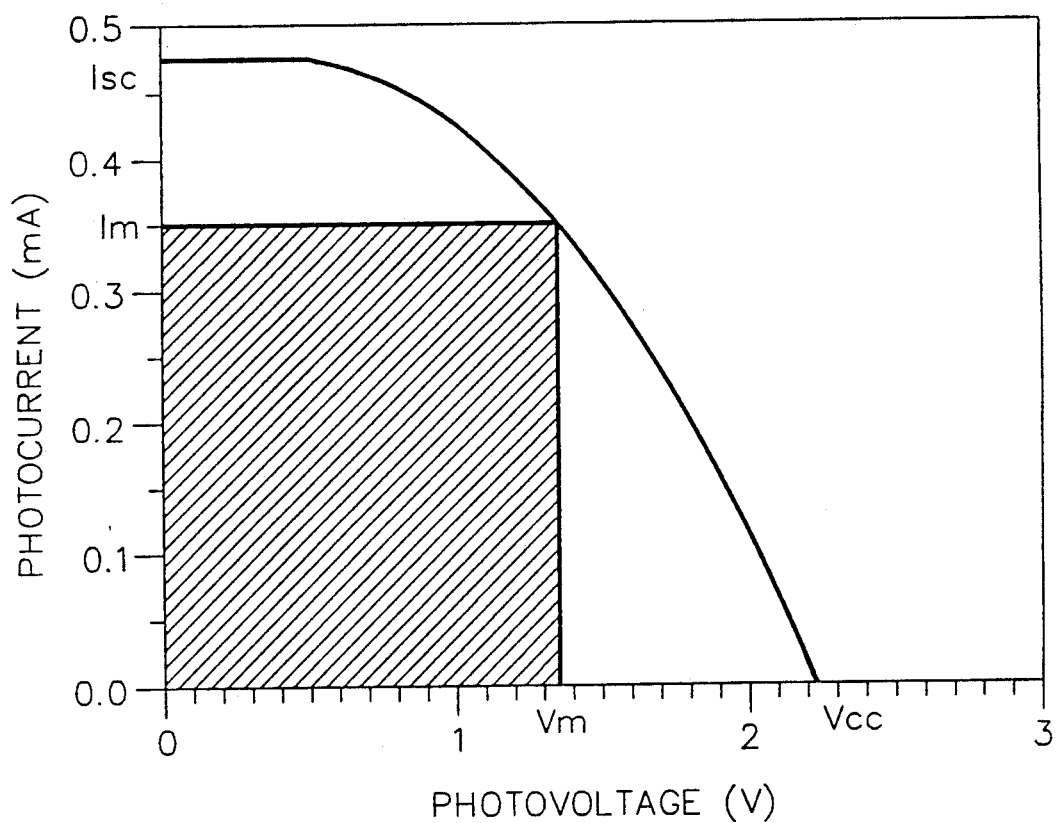
FIG. 7 is a plot of the primary operating area of the photodiode of the present invention bounded by its open circuit voltage and short circuit current.

FIG. 7 is a representative plot of the photocurrent versus the photovoltage for photodiodes according to the present invention. FIG. 7 shows exemplary values for a photodiode with a device area of 0.09 square centimeters (cm$^2$) illuminated at about $7 \times 10^{-3}$ watts/cm$^2$ at wavelengths of between about 200 and 350 nm. As illustrated therein, the short circuit current ($I_{SC}$) is 0.475 milliamps (mA) and the open circuit voltage ($V_{OC}$) is 2.28 volts (V). The shaded rectangle represents the area of maximum power output and illustrates that the maximum current at maximum power ($I_m$) is approximately 0.35 mA and the maximum voltage at maximum power ($V_m$) is 1.35 V.

These and related properties are also summarized in Table 2:

TABLE 2

| Active Area (mm$^2$) | Responsivity (mA/watt) | Spectral Response ($\mu$A/(W/cm$^2$)) | Dark Current (pA at $-1$ V) | Junction Capacitance (nF at 0 V) | Open Circuit Voltage (V) |
|---|---|---|---|---|---|
| 1 | 140-150 | 1500 | 0.001 | 0.160 | 2.35 |
| 4 | 140-150 | 6000 | 0.002 | 0.460 | 2.35 |
| 9 | 140-150 | 13500 | 0.005 | 0.640 | 2.35 |

Figure 2:
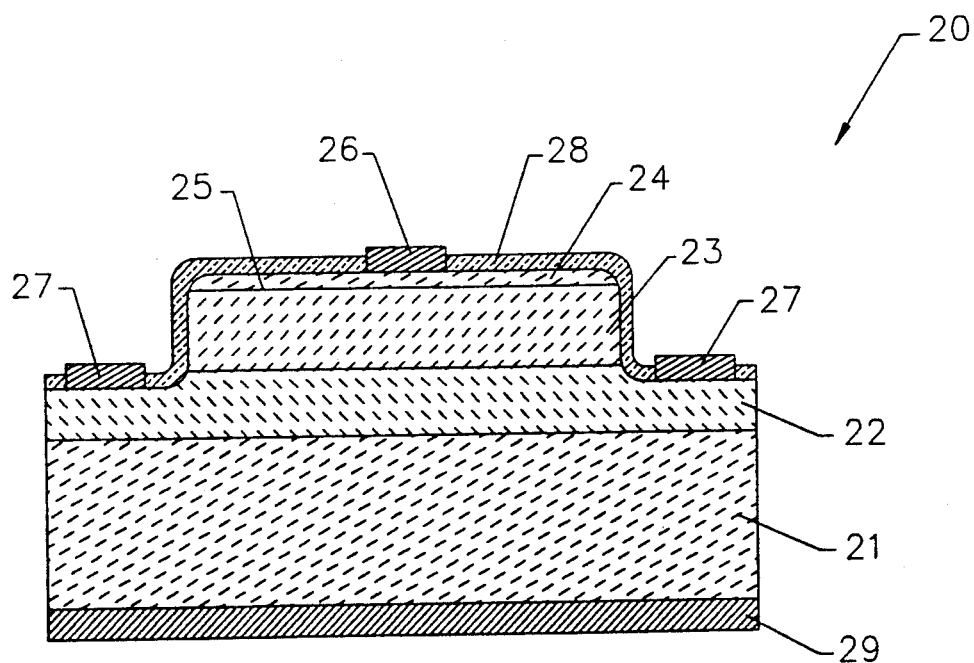
FIG. 2 is another cross sectional view of a second embodiment of a photodetector according to the present invention.

A second embodiment of the invention is shown in FIG. 2 as the photodiode generally designated at 20. This embodiment generally corresponds to the embodiment illustrated in FIG. 1, with the exception that the substrate comprises a bulk single crystal 21 with an additional epitaxial layer 22 there. The additional epitaxial layer 22 has the first conductivity type as does the first epitaxial layer 23 while the bulk substrate 21 has the opposite conductivity type rather than identical conductivity type as in the diode illustrated in FIG. 1. In turn, the first epitaxial layer 23 has the same conductivity type as the additional epitaxial layer 22 but has a carrier concentration generally less than that of the additional epitaxial layer 22.

The conductivity of the additional layer 22 is sufficiently high to minimize contact resistance and its thickness is sufficient to minimize sheet resistance. In preferred embodiments, layer 22 has a carrier concentration of between about 5 and $20 \times 10^{18}$ cm$^{-3}$ and a thickness of between about 10 and 20 microns.

The top layer is designated at 24 and as in the first embodiment has a carrier concentration that is sufficiently greater than the carrier concentration of the first layer 23 so that the depletion region at equilibrium or zero bias forms predominantly in the first layer 23.

The first layer 23 and the top layer 24 form a p-n junction 25 therebetween. Respective ohmic contacts 26 and 27 are made to the top layer 24 and to the additional epitaxial layer 22. By positioning the ohmic contacts on the additional epitaxial layer 22 rather than on the substrate 21, two goals are accomplished. First, a device having both contacts on the same surface (horizontal geometry) rather than on opposite surfaces (vertical geometry) is formed; and second, junction behavior at the border between the substrate 21 and the additional epitaxial layer 22 is avoided. If desired, an additional ohmic contact 29 can be added to the substrate 21 to ground the device when desired or necessary. As in the first embodiment, an anti-reflective coating 28 can be added to the photodiode. The photodiode 20 illustrated in FIG. 2 also shares the functional characteristics of the diode 10 illustrated in FIG. 1, namely the defined thickness of the first layer 23 and the top layer 24.

As also set forth with respect to the first embodiment 10, in preferred embodiments the thickness of the top layer 24 of the second embodiment 20 is no more than about 300 nm, while the preferred thickness of the second layer 23 is between about 2 and 5 microns.

Figure 8:
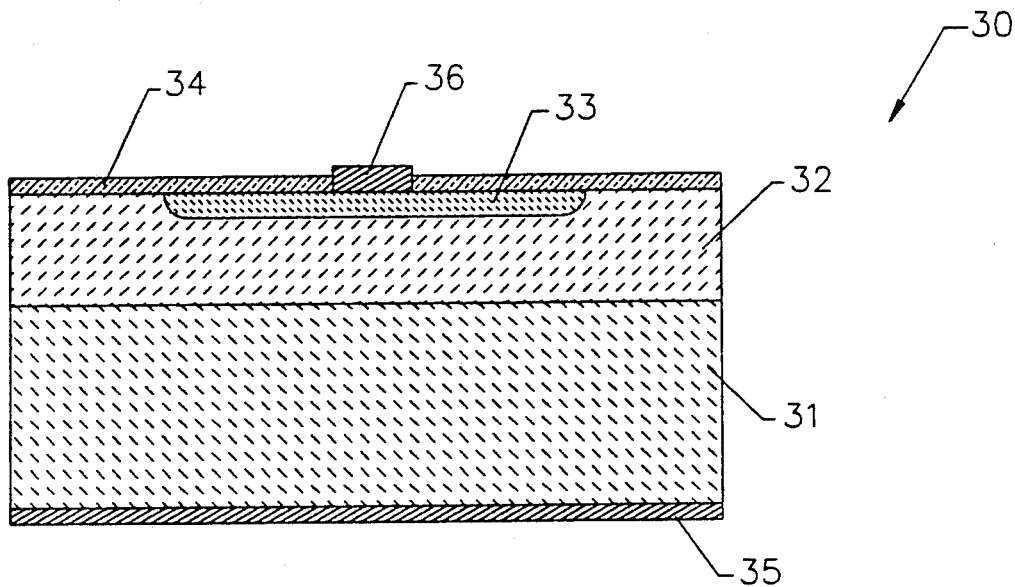
FIGS. 8-11 are respective cross-sectional views of additional embodiments of photodiodes according to the present invention.

FIGS. 8 through 11 illustrate other embodiments of the invention. FIG. 8 shows a photodiode according to the invention generally designated at 30. In this embodiment, the photodiode comprises a silicon carbide substrate 31 having a first conductivity type and an epitaxial layer 32 upon the substrate 31. Epitaxial layer 32 has the same conductivity type as substrate 31, and in a preferred embodiment, both are p-type conductivity with the substrate having the resistivity and the epitaxial layer 32 having the carrier concentration set forth earlier herein. Instead of a second epitaxial layer, however, the p-n junction is formed by an implanted well 33 of n-type silicon carbide. In preferred embodiments, the well 33 is formed by the high temperature implantation process set forth in application Ser. No. 365,333 as incorporated earlier herein. This technique has the advantage of forming the planar geometry shown in FIG. 8 where such is necessary or convenient. As additionally set forth in the '333 application, the high temperature ion implantation technique both implants and activates dopant atoms with far less damage than previous implantation attempts into silicon carbide, and thus produces far better electronic characteristics.

As in other embodiments, an appropriate antireflective coating 34 can be added to the structure and the respective ohmic contacts 35 to the substrate and 36 to the well complete the electronic structure of this embodiment.

Figure 9:
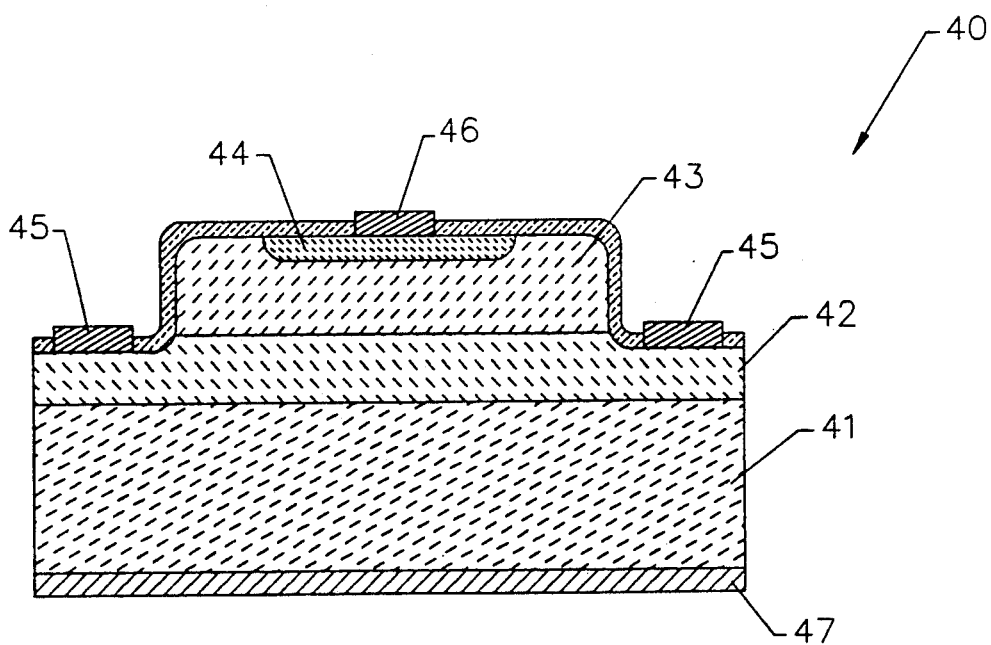

Another embodiment is illustrated in FIG. 9 in which the photodiode is generally designated at 40. This embodiment includes a substrate 41 having a first conductivity type, and then adjacent epitaxial layers 42 and 43 which have the same conductivity type as one another, and the opposite conductivity type from the substrate 41. As in the embodiment illustrated in FIG. 8, the p-n junction is formed by implanting a well 44 into the top epitaxial layer 43, so that the p-n junction is formed between the well 44 and epitaxial layer 43. In order to apply a bias across the p-n junction, ohmic contacts 45 are made to epitaxial layer 42, and ohmic contact 46 is made to the well 44. If desired, an additional ohmic contact 47 can be added to the substrate 41 to ground the device when desired or necessary. In this embodiment, a preferred arrangement is for the substrate 41 to be n-type, the first epitaxial layer 42 to be a more highly populated p-type layer (5-20E18), second epitaxial layer 43 to be a less populated p-type layer (0.1- 10E17), and the well to be a more highly populated n-type region (5-20E18).

Figure 10:
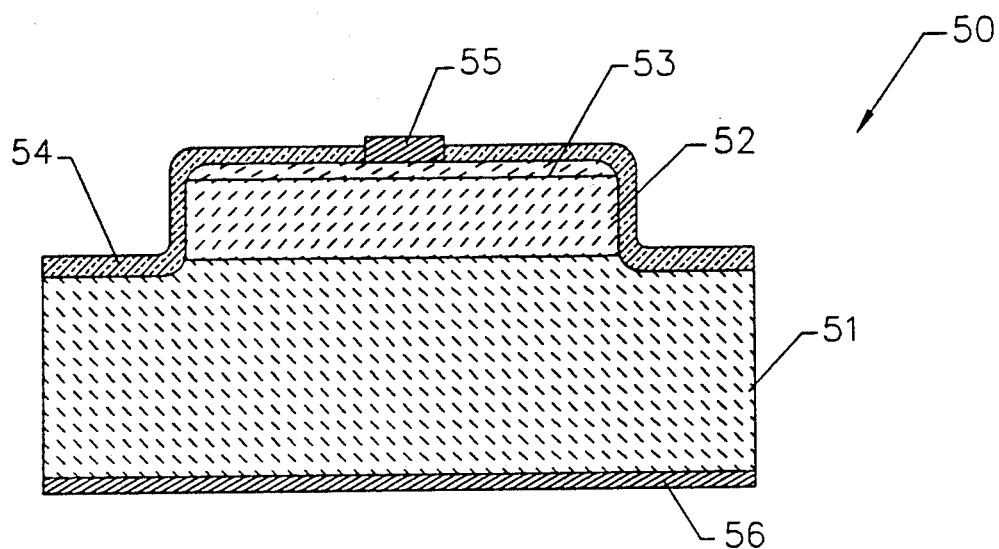

FIG. 10 shows yet another embodiment broadly designated at 50. This embodiment likewise includes a substrate 51 and a first epitaxial layer 52 upon the substrate 51. Both substrate 51 and epitaxial layer 52 are formed of silicon carbide having the same conductivity type. A p-n junction is formed in this device by implanting the entire top portion of epitaxial layer 52 to form an implanted layer 53 of opposite conductivity type so that a p-n junction is formed between the portion 53 and the epitaxial layer 52. As in other embodiments, an antireflective coating 54 can be added to the device and respective ohmic contacts 55 to the implanted portion 53 and 56 to the substrate 51 complete the electronic structure of the device. As in the other embodiments, each of the respective layers can be formed from p or n type silicon carbide depending upon the desired arrangement, but in preferred embodiments the substrate 51 is p-type, the epitaxial layer is a less highly populated p-type, and the implanted region 53 is a more highly populated n-type.

Figure 11:
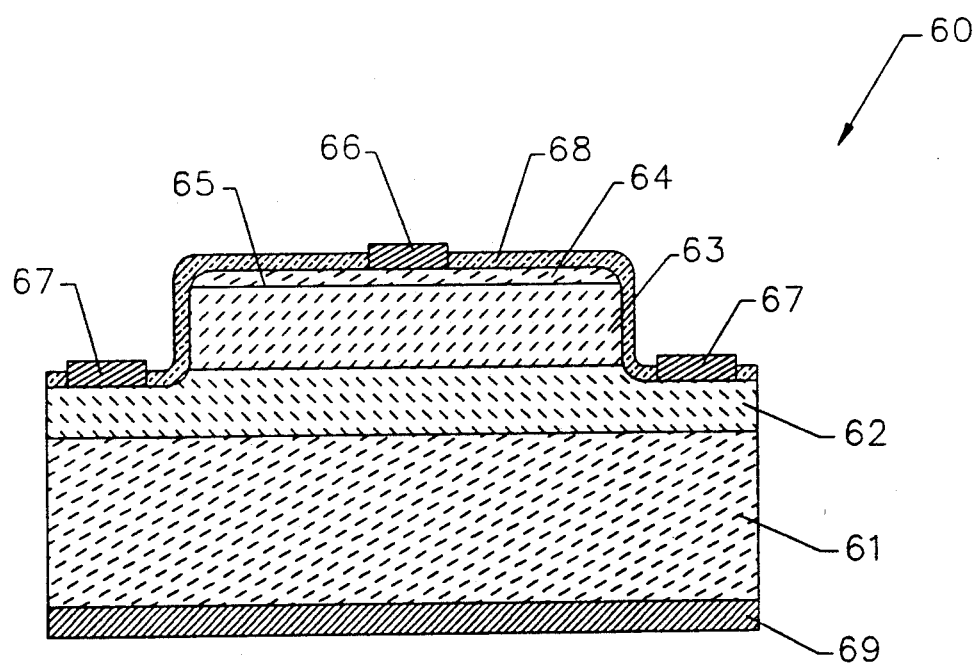

FIG. 11 shows yet another embodiment broadly designated at 60. This embodiment is analogous to the embodiment disclosed in FIG. 2 with the difference being that the top layer is an implanted layer rather than an epitaxial layer. Photodiode 60 includes a substrate 61, an additional epitaxial layer 62, a first epitaxial layer 63 and the top epitaxial layer 64. Respective ohmic contacts 66 and 67 are made to the top layer 64 and to the additional layer 62 and the surface of the photodiode is covered by the antireflective coating 68. The junction is indicated at 65, and an additional ohmic contact for grounding purposes as described previously is indicated at 69.

In another embodiment, the invention can be considered as a photodiode formed in silicon carbide that comprises a monocrystalline silicon carbide substrate, a first monocrystalline portion of silicon carbide upon the substrate and having a first conductivity type, a second monocrystalline portion of silicon carbide adjacent to first portion and having the opposite conductivity type from the first portion. A p-n junction is formed between the adjacent first and second portions for providing a dark current density of no more than about $1 \times 10^{-9}$ amps cm$^2$ at a reverse bias of $-1.0$ volts and at temperatures of 170° C. or less.

Because minority carriers are thermally generated, the dark current for such a diode according to the present invention has been found to decrease substantially with lower temperatures so that in a more preferred embodiment, the p-n junction provides a dark current density of no more than about $1 \times 10^{-11}$ amps cm$^2$ at a reverse bias of $-1.0$ volts and at temperatures of 100° C. or less, and in a most preferred embodiment, the junction provides a dark current density of no more than about $7 \times 10^{-13}$ amps/cm$^2$ at a reverse bias of $-1.0$ volts and at temperatures of 60° C. or less. Photodiodes according to the present invention can be formed according to the methods discussed in the incorporated patent references. In particular, photodiodes according to the present invention can be formed by forming an epitaxial layer of silicon carbide upon a bulk monocrystalline silicon carbide substrate, and then adding a second epitaxial layer upon the first epitaxial layer to serve as the top layer of the photodiode. Relatively small ohmic contacts are made to the top portions of such devices for the purpose of minimizing interference with the incident light, while a large ohmic contact can be made to the substrate or other portions unaffected by incident light for reducing contact resistance. Typically, the contacts are annealed to provide appropriate ohmic behavior.

As mentioned earlier, when epitaxial layers are formed between portions of alpha silicon carbide, they are done in accordance with the teaching of incorporated U.S. Pat. No. 4,912,064. When an epitaxial layer of beta silicon carbide is to be made on alpha silicon carbide, the technique is done in accordance with the teachings of incorporated U.S. Pat. No. 4,912,063. Finally, where the junction is to be formed by ion implantation, this is done in accordance with the teachings of the co-pending '333 application. In another aspect, the invention comprises a method of detecting and measuring ultraviolet radiation. The method comprises exposing a photodiode to electromagnetic radiation wherein the photodiode is formed of adjacent regions of silicon carbide having respective p-type and n-type conductivities with a p-n junction between the respective regions and wherein the diode has a dark current density of no more than about $1 \times 10^{-9}$ amps/cm$^2$ at $-1.0$ volts reverse bias at a temperature of about 170° C. or less. As is known to those familiar with the operation of such devices, the dark current is temperature dependent all other conditions being equal. Therefore, the method can be expressed in analogous fashion for various temperatures and the these have been set forth earlier in Table 1. As exemplary values, however, the method can comprise exposing a diode that has a dark current density of no more than about $1 \times 10^{-11}$ amps/cm$^2$ at $-1.0$ V reverse bias at a temperature of 100° C. or less, or that has a dark current density of no more than about $7 \times 10^{-13}$ amps/cm$^2$ at $-1.0$ V reverse bias at a temperature of 60° C. or less.

In the drawings and specification, there have been disclosed typical preferred embodiments of the invention, and although specific terms have been employed, they have been used in a generic and descriptive sense only and not for purposes of limitation, the scope of the invention being set forth in the following claims.

That which is claimed is:

1. A high sensitivity ultraviolet radiation detecting photodiode formed in silicon carbide and comprising:
    a single crystal substrate of silicon carbide having a first conductivity type;
    a first epitaxial layer of silicon carbide upon said substrate and having the same conductivity type as said substrate;
    a top epitaxial layer of silicon carbide upon said first epitaxial layer for being exposed to incident electromagnetic radiation, and having the opposite conductivity type from said first layer and said substrate;
    said first epitaxial layer and said top epitaxial layer forming a p-n junction therebetween;
    said first layer having a carrier concentration sufficiently lower than the carrier concentration of said top layer so that the depletion region of said p-n junction forms predominantly in said first layer at equilibrium;
    said first layer further having a defined thickness that is sufficient to support said depletion region and that is greater than the diffusion length of minority carriers in said first layer so that electron-hole pairs generated by photons absorbed in said first layer will diffuse to said depletion region within their carrier lifetimes;
    said top epitaxial layer having a defined thickness less than the thickness of said first layer and that is larger than the zero bias depletion layer width in said top layer while small enough to avoid substantial absorption of ultraviolet radiation in said top layer and thin enough so that radiation in the ultraviolet range generates carriers predominantly in said depletion region of said p-n junction;
    said top epitaxial layer further having a carrier concentration large enough to substantially reduce the series and sheet resistance; and
    ohmic contacts to said top epitaxial layer and to said substrate.

2. A photodiode according to claim 1 wherein said substrate has p-type conductivity, said first epitaxial layer has p-type conductivity, and said top epitaxial layer has n-type conductivity.

3. A photodiode according to claim 2 wherein said ohmic contact to said top epitaxial layer comprises nickel and said ohmic contact to said substrate comprises aluminum or an aluminum alloy.

4. A photodiode according to claim 1 wherein said substrate has n-type conductivity, said first epitaxial layer has n-type conductivity, and said top epitaxial layer has p-type conductivity.

5. A photodiode according to claim 4 wherein said ohmic contact to said top epitaxial layer comprises aluminum or an aluminum alloy and said ohmic contact to said substrate comprises nickel.

6. A photodiode according to claim 1 wherein the thickness of said top epitaxial layer is sufficiently greater than the thickness of said ohmic contact to said top epitaxial layer to prevent spiking of the ohmic contact through said top epitaxial layer to said first epitaxial layer therebeneath.

7. A photodiode according to claim 6 wherein the ratio of the thickness of said top epitaxial layer to the thickness of said ohmic contact is at least about 4:1.

8. A photodiode according to claim 6 wherein the ratio of the thickness of said top epitaxial layer to the thickness of said ohmic contact is between about 4:1 and 6:1.

9. A photodiode according to claim 1 wherein said substrate and said first and top epitaxial layers are formed from a single polytype of silicon carbide.

10. A photodiode according to claim 9 wherein said single polytype is selected from the group consisting of 6H, 4H, 2H, 15R, and 3C.

11. A photodiode according to claim 1 and further comprising an antireflective coating upon said top layer.

12. A photodiode according to claim 11 wherein said antireflective coating is selected from the group consisting of silicon dioxide and aluminum oxide.

13. A high sensitivity ultraviolet radiation detecting photodiode formed in silicon carbide and comprising:
    a single crystal substrate of silicon carbide having a first conductivity type;

an additional epitaxial layer of silicon carbide upon said substrate and having the opposite conductivity type from said substrate;

a first epitaxial layer of silicon carbide upon said additional epitaxial layer and having the same conductivity type as said additional epitaxial layer;

a top epitaxial layer of silicon carbide upon said first epitaxial layer for being exposed to incident electromagnetic radiation, and having the opposite conductivity type from said first layer and said additional layer;

said first epitaxial layer and said top epitaxial layer forming a p-n junction therebetween;

said first layer having a carrier concentration sufficiently lower than the carrier concentration of said top layer so that the depletion region of said p-n junction forms predominantly in said first layer at equilibrium;

said first layer further having a defined thickness that is sufficient to support said depletion region and that is greater than the diffusion length of minority carriers in said first layer so that electron-hole pairs generated by photons absorbed in said first layer will diffuse to said depletion region within their carrier lifetimes;

said top epitaxial layer having a defined thickness less than the thickness of said first layer and that is larger than the zero bias depletion layer width in said top layer while small enough to avoid substantial absorption of ultraviolet radiation in said top layer and thin enough so that radiation in the ultraviolet range generates carriers predominantly in said depletion region of said p-n junction;

said top epitaxial layer further having a carrier concentration large enough to substantially reduce the series and sheet resistance; and ohmic contacts to said top epitaxial layer and to said substrate.

14. A high sensitivity ultraviolet radiation detecting photodiode formed in silicon carbide and comprising:
   a single crystal substrate of alpha silicon carbide having a first conductivity type;
   a first epitaxial layer of silicon carbide upon said substrate and having the same conductivity type as said substrate;
   a top epitaxial layer of silicon carbide upon said first epitaxial layer and having the opposite conductivity type from said first layer and said substrate, said top layer having a thickness of no more than about 300 nanometers;
   a p-n junction between said first epitaxial layer and said top epitaxial layer; and
   ohmic contacts to said substrate and to said top layer.

15. A photodiode according to claim 14 wherein said silicon carbide substrate comprises alpha silicon carbide and has a flat interface surface that is inclined more than one degree off axis with respect to a basal plane thereof substantially towards one of the <11$\bar{2}$0> directions, and with said first epitaxial layer comprising alpha silicon carbide homoepitaxially deposited on said substrate interface surface.

16. A photodiode according to claim 14 wherein said substrate comprises 6H alpha silicon carbide and said first epitaxial layer comprises beta silicon carbide upon said substrate and having the opposite conductivity type from said substrate and wherein said beta silicon carbide is epitaxially deposited in the [111] growth direction on the (0001) Si face of said 6H silicon carbide substrate such that the (111) crystallography of the beta silicon carbide thin film matches the (0001) crystallography of the 6H silicon carbide substrate and such that the beta silicon carbide (10$\bar{1}$) face is parallel to the 6H silicon carbide (11/0) face and the beta silicon carbide (111) face is parallel to the 6H silicon carbide (0001) face.

17. A photodiode according to claim 14 wherein the carrier concentration of said top layer is greater than the carrier concentration of said first layer by an amount sufficient for the depletion region to form predominantly in said first layer.

18. A photodiode according to claim 14 wherein said first epitaxial layer has a thickness of between 2 and 5 microns.

19. A high sensitivity ultraviolet radiation detecting photodiode formed in silicon carbide and comprising:
   a single crystal substrate of alpha silicon carbide having a first conductivity type;
   an additional epitaxial layer of silicon carbide upon said substrate and having the opposite conductivity type from said substrate;
   a first epitaxial layer of silicon carbide upon said additional epitaxial layer and having the same conductivity type as said additional epitaxial layer;
   a top epitaxial layer of silicon carbide upon said first epitaxial layer and having the opposite conductivity type from said first layer and said additional layer, said top layer having a thickness of no more than about 300 nanometers;
   a p-n junction between said first epitaxial layer and said top epitaxial layer; and
   ohmic contacts to said substrate and to said top layer.

20. A high sensitivity radiation detecting photodiode formed in silicon carbide and comprising:
   a monocrystalline silicon carbide substrate
   a first monocrystalline portion of silicon carbide upon said substrate and having a first conductivity type;
   a second monocrystalline portion of silicon carbide adjacent said first portion and having the opposite conductivity type from said first portion; and
   a p-n junction between said adjacent first and second portions for providing a dark current density of no more than about $1 \times 10^{-9}$ amps/cm$^2$ at a reverse bias of $-1.0$ volts and at temperatures of 170° C. or less.

21. A photodiode according to claim 20 wherein said p-n junction provides a dark current density of no more than about $1 \times 10^{-11}$ amps/cm$^2$ at a reverse bias of $-1.0$ volts and at temperatures of 100° C. or less.

22. A photodiode according to claim 20 wherein said p-n junction provides a dark current density of no more than about $7 \times 10^{-13}$ amps/cm$^2$ at a reverse bias of $-1.0$ volts and at temperatures of 60° C. or less.

23. A photodiode according to claim 20 wherein said first monocrystalline portion of silicon carbide comprises an epitaxial layer upon said substrate and said second portion comprises a well within said epitaxial layer.

24. A photodiode according to claim 23 wherein said well comprises an ion implanted well.

25. A method of detecting and measuring ultraviolet radiation, the method comprising:
   exposing a photodiode to electromagnetic radiation wherein the photodiode is formed of adjacent regions of silicon carbide having respective p-type and n-type conductivities with a p-n junction between the respective regions and wherein the diode has a dark current density of no more than about $1\times10^{-9}$ amps/cm$^{-2}$ at a reverse bias of $-1.0$ volts and at temperatures of 170° C. or less.

26. A method according to claim 25 wherein the step of exposing the photodiode comprises exposing a photodiode that has a dark current density of no more than about $1\times10^{-11}$ amps/cm$^{-2}$ at a reverse bias of $-1.0$ volts and at temperatures of 100° C. or less.

27. A method according to claim 25 wherein the step of exposing the photodiode comprises exposing a photodiode that has a dark current density of no more than about $7\times10^{-13}$ amps/cm$^{-2}$ at a reverse bias of $-1.0$ volts and at temperatures of 60° C. or less.

* * * * *

UNITED STATES PATENT AND TRADEMARK OFFICE
CERTIFICATE OF CORRECTION

PATENT NO. : 5,093,576
DATED : March 3, 1992
INVENTOR(S) : Edmond et al.

It is certified that error appears in the above-indentified patent and that said Letters Patent is hereby corrected as shown below:

At column 12, line 9, "Miss." should be --MO--.

At column 12, line 54, "there" should be --thereon--.

IN THE CLAIMS:

At column 17, line 38, "substrate" should be --additional epitaxial layer--.

At column 18, line 5, "(11/0)" should be --(11$\bar{2}$0)--.

At column 18, line 33, "substrate" should be --additional epitaxial layer--.

Signed and Sealed this

Second Day of November, 1993

*Attest:*

BRUCE LEHMAN

*Attesting Officer*  Commissioner of Patents and Trademarks